(12) United States Patent
Rutkiewicz

(10) Patent No.: US 12,477,947 B2
(45) Date of Patent: Nov. 18, 2025

(54) POWERING SENSOR PACKAGES IN MOVING PLATFORMS

(71) Applicant: Simmonds Precision Products, Inc., Vergennes, VT (US)

(72) Inventor: Robert D. Rutkiewicz, Edina, MN (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 17/571,062

(22) Filed: Jan. 7, 2022

(65) Prior Publication Data

US 2023/0225210 A1 Jul. 13, 2023

(51) Int. Cl.
*H10N 10/17* (2023.01)
*F42B 15/01* (2006.01)
*F42B 15/34* (2006.01)

(52) U.S. Cl.
CPC .............. *H10N 10/17* (2023.02); *F42B 15/01* (2013.01); *F42B 15/34* (2013.01)

(58) Field of Classification Search
CPC .......... H10N 10/17; F42B 15/01; F42B 15/34
See application file for complete search history.

(56) References Cited

U.S. PATENT DOCUMENTS

| | | | |
|---|---|---|---|
| 3,839,094 A * | 10/1974 | Campagnuolo | F42C 14/00 310/11 |
| 4,421,029 A | 12/1983 | Wich | |
| 7,506,587 B1 | 3/2009 | Pereira et al. | |
| 2003/0047103 A1 | 3/2003 | Rabin | |
| 2009/0151321 A1 | 6/2009 | Jarmon et al. | |
| 2012/0152297 A1* | 6/2012 | Mitchell | H02K 29/08 136/205 |
| 2019/0154403 A1* | 5/2019 | Choiniere | F41G 7/2253 |

FOREIGN PATENT DOCUMENTS

CN 106533264 A 3/2017

OTHER PUBLICATIONS

Extended European Search Report issued in corresponding EP Patent Application No. 22213624.4 on Jun. 9, 2023.

* cited by examiner

*Primary Examiner* — Tamir Ayad

(57) ABSTRACT

In accordance with at least one aspect of this disclosure, a thermoelectric generator (TEG) system can include a TEG conversion element configured to be in thermal communication with a leading edge surface subject to hypersonic flow and a heatsink to generate a temperature differential across the TEG conversion element mounted between the leading edge surface and heatsink, and an electrical conductor configured to connect between the TEG conversion element and a powered unit to supply electrical energy from the TEG conversion element to the powered unit.

20 Claims, 1 Drawing Sheet

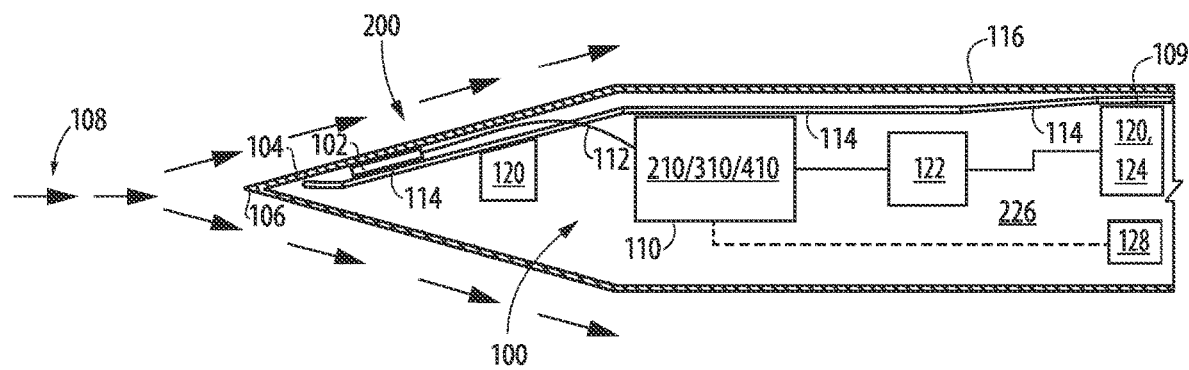

POWERING SENSOR PACKAGES IN MOVING PLATFORMS

TECHNICAL FIELD

The present disclosure relates to moving platforms, and more particularly to powering sensor packages within the moving platform.

BACKGROUND

Sensor packages in moving platforms may operate for limited durations during a platform flight. Supplying electrical power to the sensor package can be constrained by battery weight and size, or power availability given the number of components that need to be powered. The complexity of the platform's power supply system can be reduced if the sensor package independently harvests energy for example, from a source independent of the existing battery. This disclosure provides a solution for this need.

SUMMARY

In accordance with at least one aspect of this disclosure, a thermoelectric generator (TEG) system includes a TEG conversion element configured to be in thermal communication with a leading edge surface subject to hypersonic flow and a heatsink to generate a temperature differential across the TEG conversion element and the leading edge surface and an electrical conductor configured to connect between the TEG conversion element and a powered unit to supply electrical energy from the TEG conversion element to the powered unit.

In embodiments, a heat pipe can be configured to thermally communicate between the TEG conversion element and an aft surface to maintain a maximum temperature of the leading edge surface. In embodiments, the heat pipe can be configured to thermally communicate between the TEG conversion element and an aft surface of the projectile to maintain the temperature differential across the TEG conversion element. In certain embodiments, the heat pipe can convey a working fluid therein and can be configured to be in thermal communication with one or more additional internal components to cool the one or more additional internal components.

In embodiments, a battery power source can be operatively connected to the powered unit and/or one or more additional powered units to power the powered units and/or the one or more additional powered units. The TEG conversion element can be operatively connected to power the powered unit independent of the battery power source operatively connected to the powered unit. In certain embodiments, the TEG conversion element is operatively connected to power the powered unit before the battery power source is activated. In certain embodiments, the TEG conversion element and the battery power source can be directly connected to the powered unit without any intervening power management system connecting between either of: the TEG conversion element and the powered unit, the battery power source and the powered unit, or the battery power source and the TEG conversion element.

In embodiments, a power output of the TEG conversion element can be sufficient to maintain operation of the powered unit at a reduced power while a projectile housing the TEG system is in flight. In embodiments, the TEG conversion element can be configured to convert thermal energy from to electrical energy as a function of a speed of the projectile. In certain embodiments, the powered unit can include a sensor package.

In certain embodiments, the projectile can include a guided munition, and the sensor package can be operatively connected to a controller of the guided munition configured to guide the guided munition. In certain embodiments, the powered unit can include a processor operatively connected to the sensor package, and the processor can be configured to communicate with the controller to at least in part guide the guided munition. In certain embodiments, the powered unit can include an actuator operatively connected to at least one of the processor and/or the controller to at least in part guide the guided munition.

In accordance with at least one aspect of this disclosure, a method can include exposing a TEG conversion element to hypersonic flow, converting thermal energy from the hypersonic flow to electrical energy with the TEG conversion element, and powering a powered unit with the electrical energy generated by the TEG conversion element.

In embodiments, powering can include powering the powered unit with the electrical energy generated by the TEG conversion element and without powering the powered unit with a supplemental power source. In certain embodiments, powering can include powering the powered unit without control by a power management system operatively connected between any of the TEG conversion element, the supplemental power source, and/or powered unit.

In embodiments, converting includes generating a temperature differential across the TEG conversion element between a leading edge surface exposed to the hypersonic flow and an aft surface shielded from hypersonic flow. The method can further include, maintaining the temperature differential, and/or maintaining a maximum temperature of the leading edge surface.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain FIGURES, wherein:

FIG. 1 is a schematic side cross sectional view of a moving platform in accordance with this disclosure, showing a thermoelectric generator system.

DETAILED DESCRIPTION

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100.

In accordance with at least one aspect of this disclosure, a thermoelectric generator (TEG) system 100 can include, a TEG conversion element 102. As shown in FIG. 1, the TEG conversion element 102 can be configured to be in thermal communication with a leading edge surface 104 of a leading edge 106 of a moving platform 200 subject to hypersonic flow 108. The TEG conversion element 102 can be configured to be in thermal communication with heatsink 109, where the TEG conversion element 102 is located between the leading edge surface 104 and the cooler heatsink 109. Such thermal communications can generate a temperature differential across the TEG conversion element 102 to convert the thermal energy of the hypersonic flow 108 to electrical energy to be used by a powered unit 110, for example. An electrical conductor 112 can be configured to connect between the TEG conversion element 102 and the powered unit 110 to supply the thermally generated electrical energy to the powered unit 110.

A heat pipe 114 can be configured to thermally communicate between the TEG conversion element 102 and the heat sink 109 at an a cooler aft surface 116 in order to maintain a maximum temperature of the leading edge surface 104, and in order to maintain the temperature differential across the TEG conversion 102. In certain embodiments, the heat pipe 114 conveys a working fluid therein (or therethrough) where the working fluid can be in thermal communication with one or more additional internal components 120 to cool the one or more additional internal components 120.

In certain embodiments, the system 100 can include a battery power source 122 operatively connected to the powered unit 110 and/or one or more additional powered units 124 to power the powered units 110 and/or the one or more additional powered units 124. In operation, in certain embodiments, the TEG conversion element 102 can be operatively connected to power the powered unit 110 independent of the battery power source 122. In this way, in embodiments, the TEG conversion element 102 can be operatively connected to power the powered unit 110 before the battery power source 122 is activated. Additionally, in embodiments, both the TEG conversion element 102 and the battery power source 122 can be directly connected to the powered unit 110, without any intervening power management system connecting therebetween. Therefore, the TEG conversion element 102 can power the powered unit 110 without control or instruction from a controller or power management system. The same or similar may be true for the battery 122, where the battery power source 122 can power the powered unit 110 without control or instruction from a controller or power management system. It is also contemplated that no power management system may be connected between the battery power source 122 and the TEG conversion element 102 to switch between each power source.

In accordance with at least one aspect of this disclosure, the TEG system 100 may be housed in the moving platform 200, as shown, (e.g., a projectile), where the TEG conversion element 102 is mounted to the leading edge surface 104. In embodiments, the remainder of the components (e.g., powered unit 110, conductor 112, heat pipe 114, battery 122, and components 120, 124) of the TEG system 100 can be housed in a body 226 of the projectile 200, for example. In certain embodiments, for example as shown, the projectile 200 may be or include a guided munition, where the powered unit 110 includes a sensor package 210 (e.g., including one or more of a seeker, an imaging sensor, a radio frequency sensor, radar, optics, a datalink, and/or a communications module, among others). The sensor package 210 may be operatively connected to a controller 128 of the guided munition 200 or any number of additional sensors, configured to at least in part, guide the guided munition 200, among other functions. In certain embodiments, the powered unit 110 may be or additionally include a processor 310 operatively connected to the sensor package, such as a guidance control processor, where the processor 310 is configured to communicate with the controller 128 to at least in part guide the guided munition 200. In certain embodiments, the powered unit may be or additionally include an actuator 410 operatively connected to at least one of the processor 310 and/or the controller 128 to at least in part guide the guided munition 200, for example by actuating one or more flaps or canards, to physically maneuver the munition 200.

In embodiments, a power output of the TEG conversion element 102 can be sufficient to maintain operation of the powered unit 110 at a reduced power while a projectile 200 housing the TEG system 100 is in flight, where the TEG conversion element 102 is configured to convert thermal energy from the hypersonic flow 108 to electrical energy as a function of a speed of the projectile 200, such that the output of the TEG conversion element 102 is determined at least in part by the speed of the projectile 200 (e.g., the potential power output is proportional to the square of the velocity). For example, given powered units 110 may have different power requirements, and given TEG conversion elements 102 may be sized and configured for a certain power output and/or to operate at a certain temperature differential. Therefore, the number, size, and output of the TEG conversion elements 102 included in the system 100 can be tuned for the specific requirements of each connected powered unit 110, and for a given application as appreciated by one having ordinary skill in the art. Those having ordinary skill in the art would understand and readily appreciate how to fine tune the TEG system 100 as shown and described, for example using basic engineering principles and calculations, to fit the needs of the desired application without undue experimentation.

In accordance with at least one aspect of this disclosure, a method can include exposing a TEG conversion element (e.g., element 102) to hypersonic flow, converting thermal energy from the hypersonic flow to electrical energy with the TEG conversion element, and powering a powered unit (e.g., unit 110) with the electrical energy generated by the TEG conversion element. In embodiments, powering can include powering the powered unit with the electrical energy generated by the TEG conversion element and without powering the powered unit with a supplemental power source (e.g., without battery 122). For example, powering the powered unit may be performed without control by a power management system operatively connected between any of the TEG conversion element, the supplemental power source, and/or powered unit.

In embodiments, converting can include generating a temperature differential across the TEG conversion element, between a leading edge surface (e.g., 104) exposed to the hypersonic flow and a cooler aft surface (e.g., 116), which may be shielded from hypersonic flow. The method can include maintaining the temperature differential, for example, for as long as desired or required by the powered unit. The method can also include, maintaining a maximum temperature of the leading edge surface, for example to protect surrounding components and to protect the integrity of the leading edge surface.

Certain powered units of a projectile, for example sensor packages, or imaging systems, may only operate for limited durations during a projectile flight. Supplying electrical power to these packages can be constrained (e.g., due to battery capacity). Moreover, supplying power to these units is typically determined based on mission plan, but may still be optimized by including additional power sources, independent from a battery. For example, the different projectile components typically use various levels power at different stages during the flight. In certain situations, using a thermal battery may result in wasted energy if it is activated earlier than the projectiles peak power use. While this energy can be saved by use of ultracapacitors and/or secondary batteries, for example, power management presents a challenge to design. Embodiments as shown and described allow the complexity of the projectile's power supply system to be reduced if certain components independently harvest energy, separate from any power supplied by the internal battery.

In embodiments, the sensor packages can harvest energy from the high temperatures generated during hypersonic flight. In certain missions, the sensor packages may be used for short intervals during projectile flight, therefore it can be advantageous to avoiding imposing this need on the power management system so there is not constant monitoring and negotiation of power requirement timeline with the projectile's system design. Including a separate battery for the sensor packages may be possible, but may add additional weight or take up space (which may already be limited within the projectile), and can add complexity to the already complex power management design. Embodiments remove this complexity and require less space than additional batteries.

In embodiments, using a TEG element to harvest electrical energy converted from thermal energy allows embodiments of the system to utilize features and elements already included in hypersonic projectiles. Embodiments can decrease energy requirements on an internal projectile battery, allowing the battery to be smaller and/or increasing the amount of time before the battery is required to power a powered unit, like the sensor package. Therefore, embodiments can increase the potential range for the projectile by reducing constraints caused by battery limitations, for example, because the TEG element can provide power to the sensor package independent of the battery, and without reliance on the battery. Moreover, different mission profiles may have different trajectories and temperature timelines, therefore embodiments allow the sensor packages and powered units can adapt their power needs on a mission-by-mission basis, harvesting the energy as needed without impacting the projectile power or being constrained by the projectile's system.

Embodiments of the system can include a TEG conversion element mounted to a hot leading edge of the hypersonic projectile and to the heatsink used to cool the leading edge. In embodiments, the heatsink can be or include a heat pipe. The TEG then acts as an independent electrical source capable of harvesting the projectile's kinetic energy to provide an independent source of power to the sensor packages. A wire from the TEG can connect to the sensor package to supply the necessary power. Embodiments also provide flexibility for electrical power use during flight, while reducing interface constraints between the TEG element and a power management system, or the TEG element and the internal battery or other internal power supply.

Hypersonic flow applied to the projectile's leading-edge surfaces, can generate very high temperatures, for example, about 1100 C above ambient temperature. The aft surfaces of the projectile which may be shielded from the hypersonic flow can be much cooler. The use of heat pipes or equivalent heatsinks housed in the body of the projectile can maintain a maximum temperature of the leading edge to protect the projectile frame and any surrounding components, such as the described electronics, from experiencing excessive temperatures. The heat flux from the hot leading edge surface into the cooler TEG conversion element can generate power via the Seebeck Effect.

The temperature differential across the TEG conversion element is created by the high temperature of the leading edge surface and the cool temperature of the aft surface, thermally communicating via the heat pipe. This differential induces the heat flow, and the heat flow across the TEG conversion element generates the electrical current and voltage differential. In embodiments, the hot side if the TEG conversion element should be as close in temperature to the leading edge surface for maximum power output.

The voltage is determined by the number of layers used, the current is the temperature differential and area of the TEG. The real temperatures are dependent on the specific design. In embodiments, the output of the TEG conversion element may be sufficient to power the sensor package or other powered unit at peak power. However, in some instances, the temperature of the leading edge surface may not be sufficient to power the units at peak power. In this case, the TEG element can be designed to produce sufficient power to at least maintain operation of the powered units at low power that occurs a majority of the projectile's flight.

The voltage produced by the TEG conversion element can be determined by the number of layers used, and the current generated can be determined by the temperature differential and area of the TEG conversion element. The sizes, temperatures and power needs are therefore sufficient to power these sensor packages and powered units (e.g., actuators) at some capacity, and therefore provide a solution for harvesting power from the projectile environment, rather than including additional supplemental power sources in the projectile, such as additional batteries.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A system, comprising:
    a projectile having a body, a guidance controller, and a sensor package operatively connected to the guidance controller configured to guide the projectile in flight;
    a thermoelectric generator (TEG) system operatively connected to the projectile, the TEG system including:
        a TEG conversion element in thermal communication with a leading edge surface of the body subject to hypersonic flow during the flight of the projectile;
        a heatsink, physically separated from the TEG conversion element, thermally connected to an aft surface of the body and configured to generate a temperature differential across the TEG conversion element and the leading edge surface; and
        a heat pipe configured to:
            thermally communicate between the TEG conversion element and the heatsink at the aft surface of the body to maintain the temperature differential across the TEG conversion element; and
            thermally communicate with one or more additional components to cool the one or more additional components; and
    an electrical conductor operatively connecting between the TEG conversion element and a powered unit onboard the projectile and configured to supply electrical energy from the TEG conversion element to the powered unit,
    wherein the powered unit includes the sensor package such that the sensor package is powered by the electrical energy generated by the TEG conversion element, wherein the sensor package includes an imaging sensor, wherein the powered unit further includes at least one processor operatively connected to the imaging sensor of the sensor package and configured to process image data, and wherein the at least one processor is configured to communicate with the guidance controller to control one or more control surfaces of the projectile to at least in part guide the projectile based on the processed image data.

2. The system as recited in claim 1, wherein the heat pipe is further configured to thermally communicate between the TEG conversion element and the heatsink at the aft surface to maintain a maximum temperature of the leading edge surface.

3. The system as recited in claim 1, wherein the heat pipe is configured to convey a working fluid therein.

4. The system as recited in claim 1, further comprising a battery power source operatively connected to at least one of the powered unit or one or more additional powered units in order to power the at least one of the powered unit or the one or more additional powered units.

5. The system as recited in claim 4, wherein the TEG conversion element is operatively connected to power the powered unit independent of the battery power source operatively connected to the powered unit.

6. The system as recited in claim 5, wherein the TEG conversion element is operatively connected to power the powered unit before the battery power source is activated.

7. The system as recited in claim 6, wherein both the TEG conversion element and the battery power source are directly connected to the powered unit without any intervening power management system connecting between the TEG conversion element and the powered unit, the battery power source and the powered unit, or the battery power source and the TEG conversion element.

8. The system as recited in claim 1, wherein the TEG conversion element is configured to convert thermal energy to electrical energy as a function of a speed of the projectile.

9. The system as recited in claim 1, wherein the powered unit further includes an actuator operatively connected to one or more of the at least one processor or the guidance controller and configured to at least in part steer the projectile with the one or more control surfaces.

10. A method, comprising:
    exposing a thermoelectric generator (TEG) conversion element associated with a body of a projectile to hypersonic flow through thermal communication of the TEG conversion element with a leading edge surface of the body;
    generating a temperature differential across the TEG conversion element and the leading edge surface using a heatsink physically separated from the TEG conversion element and thermally coupled to an aft surface of the body;
    maintaining the temperature differential across the TEG conversion element using a heat pipe in thermal communication between the TEG conversion element and the heatsink at the aft surface of the body;
    cooling, using the heat pipe, one or more additional components in thermal communication with the heat pipe;
    converting thermal energy from the hypersonic flow to electrical energy using the TEG conversion element;
    powering a powered unit with the electrical energy generated by the TEG conversion element using an electrical conductor operatively connecting between the TEG conversion element and the powered unit, wherein the powered unit includes a sensor package such that the sensor package is powered by the electrical energy generated by the TEG conversion element, wherein the sensor package includes an imaging sensor; and
    communicating, using at least one processor operatively connected to the imaging sensor of the sensor package to process image data, with a guidance controller of the projectile to control one or more control surfaces of the projectile to at least in part guide the projectile based on the processed image data.

11. The method as recited in claim 10, wherein powering the powered unit includes powering the powered unit with the electrical energy generated by the TEG conversion element and without powering the powered unit with a supplemental power source.

12. The method as recited in claim 11, wherein powering the powered unit includes powering the powered unit without control by a power management system operatively connected between any of the TEG conversion element, the supplemental power source, or the powered unit.

13. The method as recited in claim 10, further comprising maintaining a maximum temperature of the leading edge surface.

14. A thermoelectric generator (TEG) system configured to be associated with a body of a projectile, the TEG system including:
   a TEG conversion element configured to be placed in thermal communication with a leading edge surface of the body subject to hypersonic flow during flight of the projectile;
   a heatsink physically separated from the TEG conversion element and configured to be thermally connected to an aft surface of the body and to generate a temperature differential across the TEG conversion element and the leading edge surface;
   a heat pipe configured to:
      thermally communicate between the TEG conversion element and the heatsink at the aft surface of the body to maintain the temperature differential across the TEG conversion element; and
      thermally communicate with one or more additional components to cool the one or more additional components; and
   an electrical conductor configured to operatively connect between the TEG conversion element and a powered unit onboard the projectile and to supply electrical energy from the TEG conversion element to the powered unit;
   wherein the TEG conversion element is configured to power a sensor package including an imaging sensor of the powered unit such that the sensor package is powered by the electrical energy from the TEG conversion element.

15. The TEG system as recited in claim 14, wherein the heat pipe is further configured to thermally communicate between the TEG conversion element and the heatsink to maintain a maximum temperature of the leading edge surface.

16. The TEG system as recited in claim 14, wherein the heat pipe is configured to convey a working fluid therein.

17. The TEG system as recited in claim 14, further comprising a battery power source configured to be operatively connected to at least one of the powered unit or one or more additional powered units in order to power the at least one of the powered unit or the one or more additional powered units.

18. The TEG system as recited in claim 17, wherein the TEG conversion element is configured to be operatively connected to power the powered unit independent of the battery power source operatively connected to the powered unit.

19. The TEG system as recited in claim 18, wherein the TEG conversion element is configured to be operatively connected to power the powered unit before the battery power source is activated.

20. The TEG system as recited in claim 19, wherein both the TEG conversion element and the battery power source are configured to be directly connected to the powered unit without any intervening power management system connecting between the TEG conversion element and the powered unit, the battery power source and the powered unit, or the battery power source and the TEG conversion element.

* * * * *